US009131549B2

(12) United States Patent
Rezeanu

(10) Patent No.: US 9,131,549 B2
(45) Date of Patent: Sep. 8, 2015

(54) DIGITAL COMMUNICATION INTERFACE CIRCUIT FOR LINE-PAIR WITH INDIVIDUALLY ADJUSTABLE TRANSITION EDGES

(71) Applicant: KONINKLIJKE PHILIPS N.V., Eindhoven (NL)

(72) Inventor: Stefan-Cristian Rezeanu, Collierville, TN (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/391,397

(22) PCT Filed: Apr. 9, 2013

(86) PCT No.: PCT/IB2013/052818
§ 371 (c)(1),
(2) Date: Oct. 9, 2014

(87) PCT Pub. No.: WO2013/153510
PCT Pub. Date: Oct. 17, 2013

(65) Prior Publication Data
US 2015/0076994 A1   Mar. 19, 2015

Related U.S. Application Data

(60) Provisional application No. 61/623,198, filed on Apr. 12, 2012.

(51) Int. Cl.
*H05B 37/02*   (2006.01)
*H03K 17/00*   (2006.01)

(52) U.S. Cl.
CPC .......... *H05B 37/0254* (2013.01); *H03K 17/00* (2013.01)

(58) Field of Classification Search
USPC ........ 315/291, 307, 308, 312, 316, 315, 314, 315/318, 320; 340/9.1, 1.1; 710/305, 306; 714/699, 799
See application file for complete search history.

(56) References Cited

U.S. PATENT DOCUMENTS 5,506,539 A   4/1996   Kelly et al.
6,876,224 B2  4/2005   Marshall et al.
(Continued)

FOREIGN PATENT DOCUMENTS

| WO | 03081777 A1 | 10/2003 |
|---|---|---|
| WO | 2005004552 A1 | 1/2005 |
| WO | 2006010417 A1 | 2/2006 |

*Primary Examiner* — David H Vu
(74) *Attorney, Agent, or Firm* — Meenakshy Chakravorty

(57) ABSTRACT

An interface circuit interfaces a device with a line-pair. The interface circuit includes: a diode bridge having polarity-independent input terminals coupled to the line-pair, and first and second output terminals having a positive polarity and a negative polarity, respectively; a first galvanic isolation device for outputting a receive signal received on the line-pair via the diode bridge; a second galvanic isolation device receiving a transmit signal; a voltage-controlled variable resistance element connected across the positive and negative output terminals of the diode bridge; and first and second filters cascaded between the second galvanic isolation device and the voltage-controlled variable resistance element. The first filter has decoupled charge and discharge paths so as to decouple the rise time and the fall time of the transmit signal. The second filter has a voltage-dependent frequency characteristic. The voltage-controlled variable resistance element couples the transmit signal to the line-pair via the diode bridge.

20 Claims, 4 Drawing Sheets

(56) References Cited

U.S. PATENT DOCUMENTS

| | | | |
|---|---|---|---|
| 7,009,348 B2 * | 3/2006 | Mogilner et al. | 315/307 |
| 8,878,644 B2 * | 11/2014 | Hick et al. | 340/3.5 |
| 2004/0225811 A1 | 11/2004 | Foster | |
| 2005/0152440 A1 | 7/2005 | Beij et al. | |
| 2008/0276154 A1 | 11/2008 | Hick et al. | |
| 2009/0003417 A1 | 1/2009 | Boeckle | |

* cited by examiner

DIGITAL COMMUNICATION INTERFACE CIRCUIT FOR LINE-PAIR WITH INDIVIDUALLY ADJUSTABLE TRANSITION EDGES

TECHNICAL FIELD

The present invention is directed generally to a digital communication interface, and more particularly to an interface circuit for interfacing a device with a line-pair such as a Digital Addressable Lighting Interface (DALI).

BACKGROUND

In recent years, new or more stringent demands have been imposed on lighting systems, such as increased requirements for energy conservation, and the need to accommodate an increasing variety of different types of lighting devices (e.g., incandescent, fluorescent, light emitting diode, etc.) with different driving requirements, with different types of lighting devices often being deployed within a same building or even the same room. These demands have driven need for more options and flexibility in the control of the lighting devices within a facility.

In response to these needs, the lighting industry developed the Digital Addressable Lighting Interface (DALI) standard for digital communications between the individual components of a lighting system. A wide variety of different DALI devices from different manufacturers can be connected together and integrated into a lighting system. This provides a high level of flexibility in configuring a lighting system while being assured of interoperability between all of the devices. Control and address capabilities allow a DALI compliant lighting system to individually control the light level of each of the luminaries as well as easily controlling light levels for groups of luminaries.

To maintain this interoperability, the DALI standard imposes requirements on the interfaces of control devices and slave devices for compatibility with other devices on a DALI bus. DALI interfaces are connected to a two-wire differential control/data bus which is common to groups of DALI interfaces. DALI messages are serial data streams and comply with a bi-phase coding, Manchester IEEE 802.3, in which the bit transitions occur between the typical voltage levels of 16 volts (H) and 0 volts (L).

FIG. 1 illustrates the voltage range relationships for the differential two-wire line (a "line-pair") of a DALI bus (which may sometimes also be referred to as a DALI loop or DALI network). A power source is usually incorporated in the master controller, providing the necessary voltage level on the DALI bus. Each DALI interface receives information by determining the voltage changes representing the bit values, and transmits information by either not clamping or clamping (shorting) the voltage across the two-wire DALI bus.

Electromagnetic interference (EMI) is a concern for many electronic devices and circuits. In particular, EMI may pose limitations on the amplitude of the high frequency harmonic components of the signals transmitted on a communication bus. For example, the DALI standard imposes both upper and lower limits on the rise and fall times (edge transitions) of the signals transmitted on a DALI bus. Compliance with these requirements must be ensured by the interface circuits of the DALI devices.

To address these requirements, several different communication interface circuits have been developed. In particular, examples of DALI interface circuits are disclosed in: U.S. Patent Application Publication 2004/0225811; U.S. Pat. No. 6,876,224; U.S. Patent Application Publication 2005/0152440; and U.S. Patent Application Publication 2009/0003417.

However, each of these communication interface circuits has certain disadvantages or limitations pertaining to complexity, cost, and/or performance.

Thus, it would be desirable to provide a communication interface circuit which can provide flexible control of the rise and fall times of the edge transitions to meet desired EMI performance without undue complexity and cost.

SUMMARY

The present disclosure is directed to inventive methods and apparatus for interfacing a device to a line-pair for digital communication, and more particularly to an interface circuit for interfacing a device to a line-pair such as a Digital Addressable Lighting Interface (DALI) bus.

Generally, in one aspect, a device includes an interface circuit configured to interface a controller with a Digital Addressable Lighting Interface (DALI) bus. The interface circuit includes: a diode bridge; a current limiter; a first optocoupler; a supply storage capacitor; a first unidirectional device; a Zener diode; a second optocoupler; a first first-order low pass filter; a second first-order low pass filter; and a field effect transistor. The diode bridge has a pair of polarity-independent input terminals configured to be coupled to the DALI bus, and further has positive and negative output terminals. The current limiter has an input and an output, wherein the input is connected to the positive output terminal of the diode bridge. The first optocoupler has first and second input terminals and first and second output terminals, wherein the first input terminal is connected to the output of the current limiter, and the output terminals are connected to a receiver. The first optocoupler is configured to couple to the receiver a receive signal received on the DALI bus via the diode bridge. The supply storage capacitor is connected via the first unidirectional device between the output of the current limiter and the negative output terminal of the diode bridge. The first unidirectional device allows current to flow from the output of the current limiter to charge a voltage on the supply storage capacitor, and prevents the voltage on the supply storage capacitor from discharging through the current limiter and the first optocoupler. The Zener diode is connected between the second input terminal of the first optocoupler and the negative output terminal of the diode bridge, and is configured to establish a voltage level of the voltage stored by the supply storage capacitor. The second optocoupler has first and second input terminals and first and second output terminals, wherein the first and second input terminals are connected to receive a transmit signal generated by the controller, and the first output terminal is connected to receive a supply voltage from the supply storage capacitor. The first first-order low pass filter has an input terminal and an output terminal, wherein the input terminal is connected to the second output terminal of the second optocoupler. The first first-order low pass filter includes: a shunt resistor connected between the input terminal of the first first-order low pass filter and the negative output terminal of the diode bridge, first and second series resistors connected between the input terminal of the first first-order low pass filter and the output terminal of the first first-order low pass filter, a second unidirectional device connected in parallel with either the first or second series resistor, and a shunt capacitor connected between the output terminal of the first first-order low pass filter and the negative output terminal of the diode bridge. The second first-order low pass filter has an input terminal and an output terminal, wherein the input terminal is connected to the output terminal of the first first-order low pass filter, a fourth resistor is connected between the input terminal and the output terminal of the second first-order low pass filter, and wherein the second first-order low pass filter has a voltage-dependent cutoff frequency. The field effect transistor has first and second terminals, drain and source, connected respectively to the positive and negative output terminals of the diode bridge, and has a gate terminal connected to the output terminal of the second first-order low pass filter.

In one embodiment, the cutoff frequency of the second first-order low pass filter decreases as a function of an increasing input voltage provided thereto when the input voltage exceeds a threshold voltage of the field effect transistor.

In another embodiment, the second first-order low pass filter includes a shunt capacitance between the gate terminal of the field effect transistor and the negative output terminal of the diode bridge, wherein the shunt capacitance increases when an input voltage to the second first-order low pass filter increases and is greater than a threshold voltage of the field effect transistor.

According to another embodiment, the device includes the controller, wherein the controller is configured to control a lighting device. According to yet another embodiment, the Zener diode has a breakdown (Zener knee) voltage that is between approximately 4.7 volts and approximately 6.2 volts.

Generally, in another aspect, a device includes an interface circuit configured to interface a controller with a Digital Addressable Lighting Interface (DALI) bus. The interface circuit includes: a diode bridge; a first optocoupler; a second optocoupler; a voltage-controlled variable resistance element; and first and second first-order low pass filters. The diode bridge has a pair of polarity-independent input terminals configured to be coupled to the DALI bus, and further has a positive output terminal and a negative output terminal. The first optocoupler is operatively connected to the diode bridge and configured to couple to a receiver a receive signal received on the DALI bus via the diode bridge. The second optocoupler is configured to receive a transmit signal generated by the controller. The voltage-controlled variable resistance element is connected across the positive and negative output terminals of the diode bridge. The first and second first-order low pass filters are cascaded between the second optocoupler and a control terminal of the voltage-controlled variable resistance element. The first first-order low pass filter includes decoupled charge and discharge paths so as to decouple a rise time of the transmit signal from a fall time of the transmit signal such that the rise time is different from the fall time. The second first-order low pass filter has a voltage-dependent cutoff frequency. The voltage-controlled variable resistance element is operatively connected to the diode bridge and configured to couple to the DALI bus via the diode bridge the transmit signal generated by the controller.

In one embodiment, the interface circuit further includes a transmit voltage supply and a transmit voltage reference for setting a voltage of the transmit voltage supply. The transmit voltage supply supplies a voltage to an output side of the second optocoupler, and the transmit voltage reference is supplied a current from the DALI bus.

According to another embodiment, the voltage-controlled variable resistance element includes a field effect transistor connected between positive and negative output terminals of the diode bridge.

According to yet another embodiment, the first first-order low pass filter includes: first and second series resistors connected between an output of the second optocoupler and an input of the second first-order low pass filter; a unidirectional device in parallel with either the first or second series resistor; and a capacitor connected between the output terminal of the first first-order low pass filter and the negative output terminal of the diode bridge.

According to still another embodiment, the cutoff frequency of the second first-order low pass filter decreases when an input voltage to the second first-order low pass filter increases and is greater than a threshold value.

According to a further embodiment, the second first-order low pass filter includes a shunt capacitance between an output of the second first-order low pass filter and the negative output terminal of the diode bridge, wherein the shunt capacitance increases when an input voltage to the second first-order low pass filter increases and is greater than a threshold value. According to one optional feature of this embodiment, the voltage-controlled variable resistance element includes a field effect transistor, and wherein the threshold value equals a threshold voltage of the field effect transistor. According to another optional feature of this embodiment, the shunt capacitance includes a gate-to-source capacitance of the field effect transistor.

According to a still further embodiment, the device further includes the controller, wherein the controller is configured to control a lighting device.

Generally, in yet another aspect, a device includes an interface circuit configured to interface a device with a line-pair. The interface circuit includes: a diode bridge; a first galvanic isolation device; a second galvanic isolation device; a voltage-controlled variable resistance element; and a first filter. The diode bridge has a pair of polarity-independent input terminals configured to be coupled to the line-pair, and further has a positive output terminal and a negative output terminal. The first galvanic isolation device is operatively connected to the diode bridge and configured to output a receive signal received on the line-pair via the diode bridge. The second galvanic isolation device is configured to receive a transmit signal. The voltage-controlled variable resistance element is connected across the positive and negative output terminals of the diode bridge. The first filter is connected between the second galvanic isolation device and the voltage-controlled variable resistance element. The first filter includes decoupled charge and discharge paths so as to decouple a rise time of the transmit signal from a fall time of the transmit signal. The voltage-controlled variable resistance element is operatively connected to the diode bridge and configured to couple the transmit signal to the line-pair via the diode bridge.

In one embodiment, the interface circuit further includes a second filter connected between the first filter and the control terminal of the voltage-controlled variable resistance element, wherein the second filter has a voltage-dependent frequency characteristic. In an optional variation of this embodiment, the first filter includes: first and second series resistors connected between an output of the second galvanic isolation device and an input of the second filter; a unidirectional device in parallel with either the first or second series resistor; and a capacitor connected between the input of the second filter and the negative output terminal of the diode bridge. According to another optional variation of this embodiment, the second filter has a cutoff frequency which decreases when an input voltage to the second filter increases and is greater than a threshold value. According to yet another optional variation of this embodiment, the second filter includes a shunt capacitance between an output of the second filter and the negative output terminal of the diode bridge, wherein the shunt capacitance increases when an input voltage to the second filter increases and is greater than a threshold value. According to still another optional variation of this embodiment, the voltage-controlled variable resistance element includes a field effect transistor, and wherein the threshold value equals a threshold voltage of the field effect transistor.

As used herein for purposes of the present disclosure, the term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A "lighting driver" is used herein to refer to an apparatus that supplies electrical power to one or more light sources in a format to cause the light sources to emit light. In particular, a lighting driver may receive electrical power in a first format (e.g., AC Mains power; a fixed DC voltage; etc.) and supplies power in a second format that is tailored to the requirements of the light source(s) (e.g., LED light source(s)) that it drives.

The term "lighting module" is used herein to refer to a module, which may include a circuit board (e.g., a printed circuit board) having one or more light sources mounted thereon, as well as one or more associated electronic components, such as sensors, current sources, etc., and which is configured to be connected to a lighting driver. Such lighting modules may be plugged into slots in a lighting fixture, or a motherboard, on which the lighting driver may be provided. Such lighting modules may be plugged into slots in a lighting fixture, or a motherboard, on which the lighting driver may be provided.

The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry; a lighting driver) relating to the operation of the light source(s).

The terms "lighting fixture" and "luminaire" are used herein interchangeably to refer to an implementation or arrangement of one or more lighting units in a particular form factor, assembly, or package, and may be associated with (e.g., include, be coupled to and/or packaged together with) other components.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which may employ one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the term "approximately" means within +/−5% of the nominal value. The term "substantially" means within 10% of the nominal value.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

As discussed above, there is a general need for a communication interface circuit which can ensure that signals transmitted by the interface satisfy specified upper and lower limits on the rise and fall times of edge transitions of signals transmitted by the interface circuit.

Therefore, the present inventor has recognized and appreciated that it would be beneficial to provide a communication interface circuit which provides more flexible control of the rise time and fall time of edge transitions of a transmitted signal.

In view of the foregoing, various embodiments and implementations of the present invention are directed to a communication interface circuit and a device that includes a communication interface circuit. In particular, various embodiments and implementations of the present invention are directed to an interface circuit which decouples the rise time and fall time of edge transitions of a transmitted signal. Furthermore, various embodiments and implementations of the present invention are directed to an interface circuit which can achieve an additional slowdown of the falling edge transition, which in some implementations is typically faster than the rising edge transition.

Figure 1:
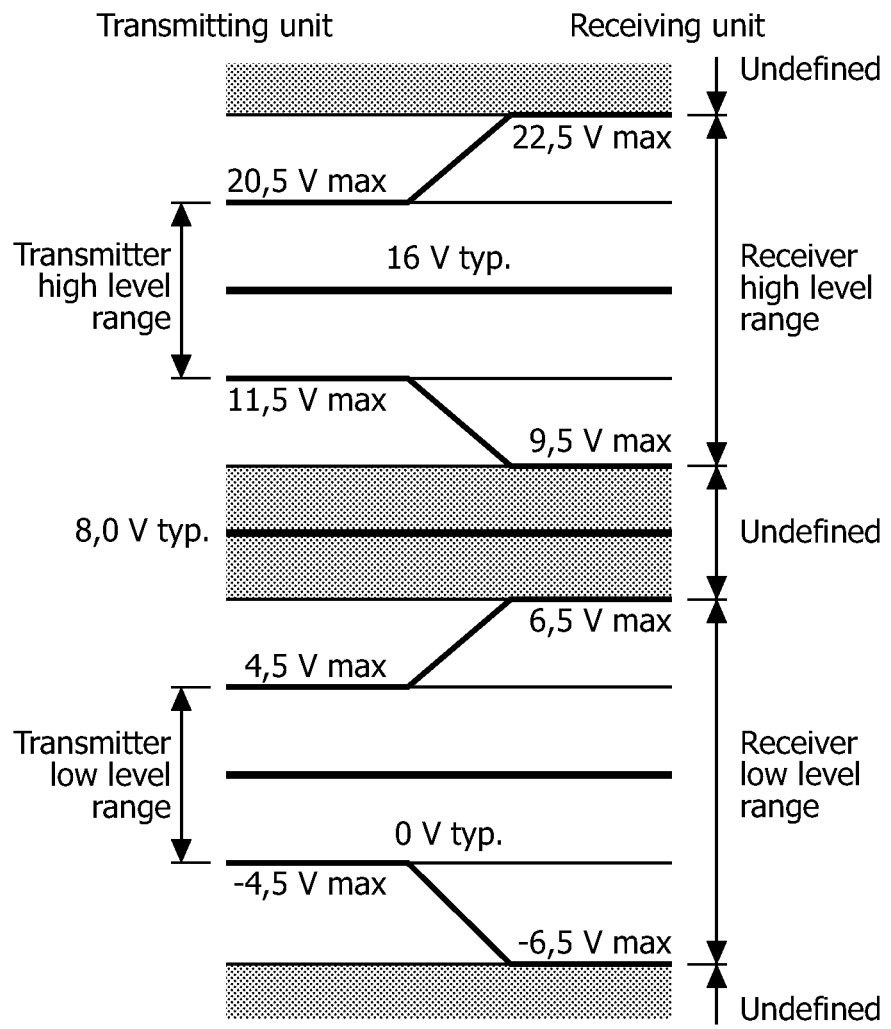
FIG. 1 illustrates voltage range relationships for the two differential voltage lines ("line-pair") of a DALI bus at both the transmitting and the receiving units.
Figure 2:
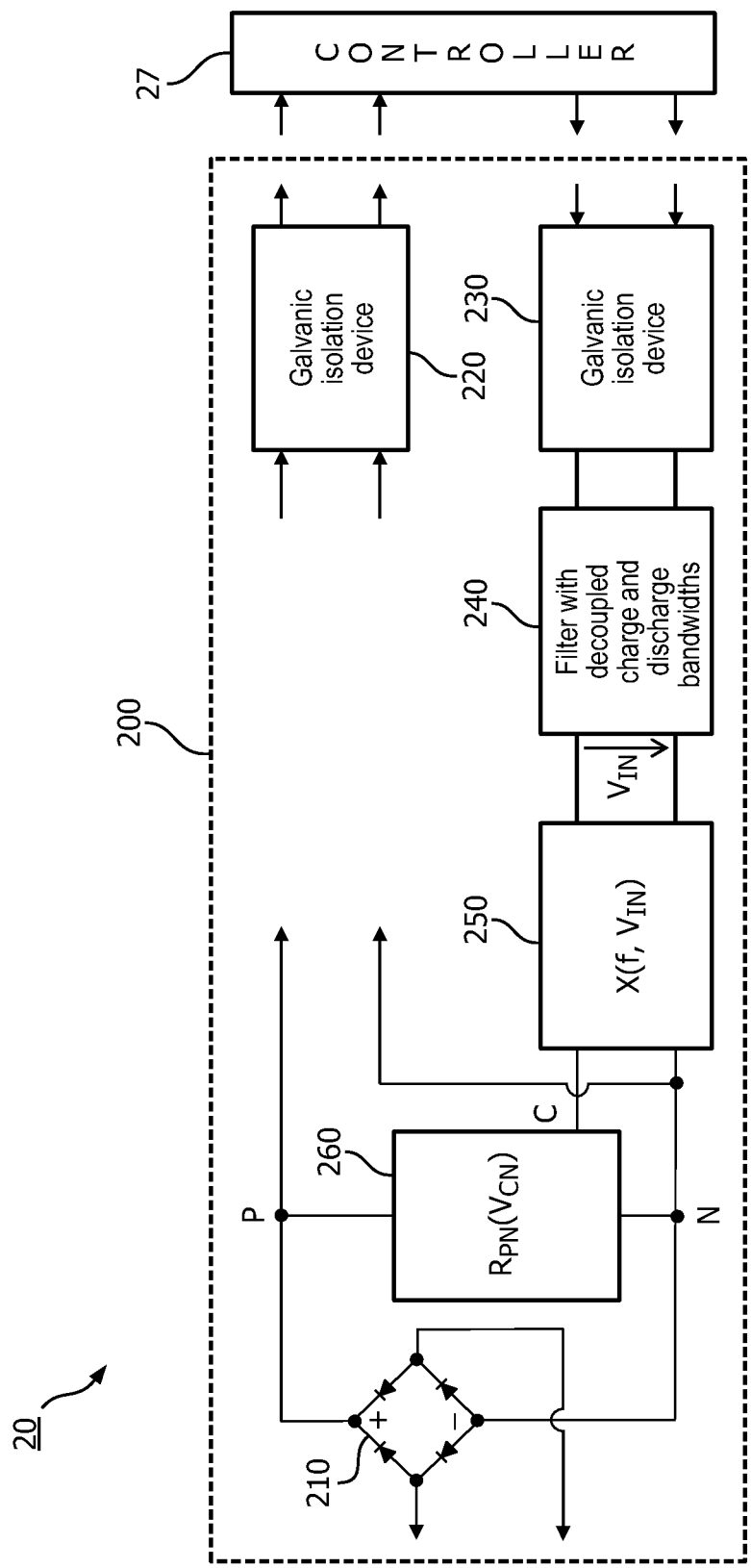
FIG. 2 is a conceptual diagram a device having an interface circuit for interfacing the device to a DALI bus, according to various embodiments of the invention.

To provide a concrete illustration of the inventive concepts disclosed in this patent application, FIG. 2 is a conceptual diagram of one embodiment of a device 20 having an interface circuit 200 for interfacing the device to a DALI bus. It should be understood that a DALI device is being provided as an example application for the inventive concepts, but the inventive concepts may be applied to other communication interfaces, and particularly to interface circuits for interfacing devices to other line-pairs.

In the example illustrated in FIG. 2, device 20 is a DALI device, and may include a controller 27 for controlling an operation of one or more lighting units or luminaires via signals communicated over the DALI bus. Each lighting unit or luminaire may include a lighting driver and/or a ballast, together with one or more light sources.

Interface circuit 200 includes: a diode bridge 210; a first galvanic isolation device 220; a second galvanic isolation device 230; a first filter 240; a second filter 250; and a voltage-controlled variable resistance element 260.

Diode bridge 210 has a pair of polarity-independent input terminals coupled to a line-pair (e.g., a DALI bus), and also has a positive output terminal and a negative output terminal.

First galvanic isolation device 220 is operatively connected to diode bridge 210 and outputs a receive signal received on the DALI bus via diode bridge 210. In device 20, first galvanic isolation device 220 outputs the receive signal to controller 27 of device 20, for example via a receive signal conditioning circuit not shown. First galvanic isolation device 220 provides an ability for interface circuit 200 to communicate the receive signal to controller 27 while maintaining galvanic isolation between the DALI bus and interface circuit 200 on one side, and the rest of device 20, including controller 27, on the other side.

Second galvanic isolation device 230 is configured to receive a transmit signal from controller 27 of device 20, for example via a controller transmit signal conditioning circuit not shown, and supplies the transmit signal to first filter 240. Second galvanic isolation device 230 provides an ability for interface circuit 200 to receive the transmit signal from controller 27 while maintaining galvanic isolation between the DALI bus and interface circuit 200 on one side, and the rest of device 20, including controller 27, on the other side.

Voltage-controlled variable resistance element 260 is connected across the positive and negative output terminals of diode bridge 210, denoted in FIG. 2 as nodes P and N, respectively. In particular, voltage-controlled variable resistance element 260 has a first terminal connected to the positive output terminal of diode bridge 210 and a second terminal connected to the negative output terminal of diode bridge 210. Voltage-controlled variable resistance element 260 also has a control terminal which is connected to the output of second filter 250 at a node denoted as C in FIG. 2 and to which a control voltage $V_{CN}$ is applied which varies the resistance $R_{PN}$ of voltage-controlled variable resistance element 260. That is, the resistance of voltage-controlled variable resistance element 260 between nodes P and N is a function of the voltage between nodes C and N: $R_{PN}(V_{CN})$. In some embodiments, voltage-controlled variable resistance element 260 has a variable resistance $R_{PN}$ which varies over a range of a low value of a few ohms (e.g., <10 ohms, such as 2-8 ohms) to a high value of several mega ohms. Interface 200 transmits a high voltage value (e.g., a voltage of 16 volts ±4.5 volts) to the line-pair (e.g., DALI bus) by causing voltage-controlled variable resistance element 260 to have a high resistance $R_{PN}$ (e.g., >1 MΩ), and transmits a low voltage value (e.g., a voltage of 0 volts±4.5 volts) to the DALI bus by causing voltage-controlled variable resistance element 260 to have a low resistance $R_{PN}$ (e.g., <10Ω). In the context of a DALI bus, data is transmitted at a given information rate (e.g., 1200 bits/s) using Manchester encoding, so that every data bit includes a portion with a high voltage value and a portion with a low voltage value. In some embodiments, voltage-controlled variable resistance element may comprise a field effect transistor (FET). In some embodiments, voltage-controlled variable resistance element 260 may have a threshold voltage $V_{TH}$ of 3-4 volts, wherein the resistance $R_{PN}$ is very low (e.g., <10Ω) for a control or input voltage $V_{CN}$ that is greater than the threshold voltage, and the resistance $R_{PN}$ is very high (e.g., >1 MΩ) for a control or input voltage $V_{CN}$ that is less than the threshold voltage.

First and second filters 240 and 250 are cascaded (a series connection) between second galvanic isolation device 230 and voltage-controlled variable resistance element 260 and provide a means for individually adjusting or controlling the rise time and fall time of edge transitions of data transmitted by interface 200. More specifically, first and second filters 240 and 250 receive a transmit signal comprising transmit data (for example data generated by processor 27) via second galvanic isolation device 230 and condition the transition edges of that transmit signal before supplying the transmit data to voltage-controlled variable resistance element 260 so as to control the EMI generated by interface 200.

First filter 240 includes decoupled charge and discharge paths for the transmit signal which is communicated from second galvanic isolation device 230. By decoupling the charge and discharge paths in first filter 240, the rise time and the fall time of the transmit signal may be separately adjusted so as to be different from each other, providing increased flexibility for managing the edge transitions of the transmit signal, and thereby managing the EMI generated by interface circuit 200. For example, in some embodiments first filter 240 may slow down the fall time of data transitions in the transmit signal to a lesser degree with respect to the rise time of data transitions in the transmit signal so as to manage the EMI generated by interface circuit 200 in a desirable fashion.

Second filter 250 has a transfer function whose frequency response is a function of the input voltage shown as $V_{IN}$ in FIG. 2: $X(f, V_{IN})$. Beneficially, second filter 250 has a voltage-dependent frequency response such that its bandwidth is reduced in a voltage region where the resistance of voltage-controlled variable resistance element 260 is decreasing so as to pull the voltage on the DALI bus low. This may achieve a desirable additional slowdown of the falling edge transitions of the transmit signal on the DALI bus, which may otherwise be faster than the rising edge transitions. Accordingly, the overall EMI generated from interface 200 may be reduced while still meeting the data transition time requirements of a DALI interface.

In some embodiments, second filter 250 may be omitted, thereby providing an advantage of simplicity but in some cases incurring a disadvantage in terms of reduced flexibility and degraded EMI performance.

Figure 3:
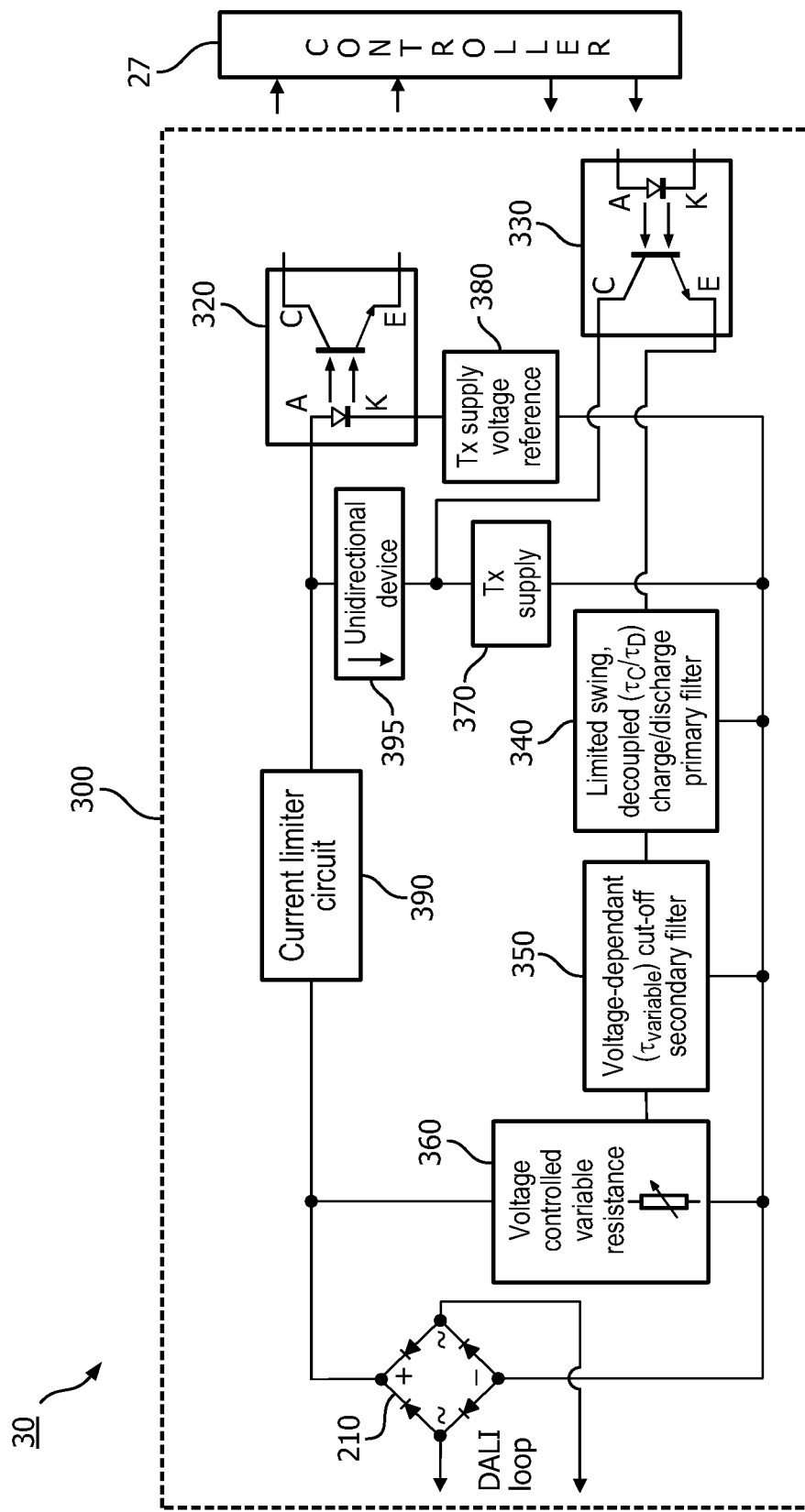
FIG. 3 is a functional block diagram of one embodiment of a device having an interface circuit for interfacing the device to a DALI bus.

FIG. 3 is a more detailed block diagram of one embodiment of a device 30 having an interface circuit 300 for interfacing the device to a DALI bus. In particular, device 30 may be one example embodiment of device 20, and interface circuit 300 may be one example embodiment of interface circuit 200.

In the example illustrated in FIG. 3, device 30 is a DALI device, and may include controller 27 for controlling an operation of one or more lighting units or luminaires via signals communicated over the DALI bus. Each lighting unit or luminaire may include a lighting driver and/or a ballast, together with one or more light sources.

Interface circuit 300 includes: diode bridge 210; a first optocoupler 320; a second optocoupler 330; a first filter 340; a second filter 350; a voltage-controlled variable resistance 360; a transmit voltage supply 370; a transmit voltage reference 380; a current limiter 390; and a first unidirectional device 395.

First optocoupler 320 has first and second input terminals and first and second output terminals. The first input terminal is operatively connected to diode bridge 210 via current limiter 390, and the output terminals are configured to output a receive signal received on the DALI bus via diode bridge 210. In device 30, the receive signal is output to controller 27 of device 30, for example via a receive signal conditioning circuit. First optocoupler 320 is one embodiment of a galvanic isolation device and in principle a different galvanic isolation device could be substituted for it in different embodiments of the interface circuit.

Second optocoupler 330 has first and second input terminals and first and second output terminals. Second optocoupler 330 is configured to receive a transmit signal between the first and second input terminals. The transmit signal may be received from controller 27, either directly or via a controller transmit signal conditioning circuit. The first output terminal (e.g., collector) of second optocoupler 330 receives a transmit voltage from transmit voltage supply 370 and the second output terminal (e.g., emitter) of second optocoupler 330 outputs the transmit data to first filter 340. Second optocoupler 330 is one embodiment of a galvanic isolation device and in principle a different galvanic isolation device could be substituted for it in different embodiments of the interface circuit.

Voltage-controlled variable resistance element 360 operates like voltage-controlled variable resistance element 260 described above and so a description thereof will not be repeated.

First and second filters 340 and 350 are cascaded (a series connection) between second optocoupler 330 and voltage-controlled variable resistance element 360 and provide a means for individually adjusting or controlling the rise time and fall time of edge transitions of data transmitted by interface 300. More specifically, first and second filters 340 and 350 receive a transmit signal comprising transmit data (for example data generated by processor 27) via second optocoupler 330 and condition the transition edges of that transmit signal before supplying the transmit data to voltage-controlled variable resistance element 360 so as to control the EMI generated by interface 300.

First filter 340 includes decoupled charge and discharge paths so as to decouple the rise time of the transmit signal from the fall time of the transmit signal. As a result, in some embodiments first filter 340 may slow down the fall time of data transitions in the transmit signal to a lesser degree with respect to the rise time of data transitions in the transmit signal. Beneficially, first filter 340 includes a first-order low pass filter. In that case, first filter 340 may have a first time constant $\tau_C$ for the charging path and a second, different, time constant $\tau_D$ for the discharge path, where $\tau_D$ may be greater than $\tau_C$. Beneficially, first filter 340 is referenced with respect to the negative output terminal of diode bridge 210.

Second filter 350 has a voltage-dependent frequency characteristic. Beneficially, second filter 350 has a voltage-dependent frequency response such that its bandwidth is reduced in a voltage region where the resistance of voltage-controlled variable resistance element 360 is decreasing so as to pull the voltage on the DALI bus low. This may achieve a desirable additional slowdown of the falling edge transitions of the transmit signal on the DALI bus, which may otherwise be faster than the rising edge transitions. Accordingly, the overall EMI generated from interface 300 may be reduced while still meeting the data transition time requirements of a DALI interface. Beneficially, second filter 350 is a first-order low pass filter. In that case, second filter 350 may have a variable time constant $\tau_{variable}$. Beneficially, second filter 350 has a cutoff frequency which decreases when the input voltage to second filter 350 increases and is greater than a threshold value. In some embodiments, the threshold value equals a threshold voltage of a FET employed for voltage-controlled variable resistance element 360. Beneficially, second filter 350 is referenced with respect to the negative output terminal of diode bridge 210. In some embodiments, second filter 350 includes a shunt capacitance between an output of second filter 350 and the negative output terminal of diode bridge 210, wherein the shunt capacitance increases when the input voltage to second filter 350 increases and is greater than the threshold value.

Beneficially, the time constant $\tau_{variable}$ of second filter 350 may be less than the time constants $\tau_C$ and $\tau_D$ of first filter 340.

In similarity to interface circuit 200, in some embodiments of interface circuit 300 second filter 350 may be omitted, thereby providing an advantage of simplicity but in some cases incurring a disadvantage in terms of reduced flexibility and degraded EMI performance.

Transmit voltage supply 370 is connected in series with first unidirectional device 395 between the output of current limiter 390 and the negative output terminal of diode bridge 210. Transmit voltage supply 370 is supplied by current from the DALI-bus via current limiter 390 and first unidirectional device 395, and supplies a transmit voltage to drive the output side of second optocoupler 330. First unidirectional device 395 allows current to flow from the output of current limiter 390 to charge transmit voltage supply 370, but prevents a current from flowing in the opposite direction from transmit supply 370 to current limiter 390 and/or first optocoupler 320 (e.g., when the receive signal corresponds to a low voltage-differential on the DALI bus). Accordingly, first unidirectional device 395 prevents the voltage of transmit voltage supply 370 from discharging through current limiter 390 and/or first optocoupler 320.

Transmit voltage reference 380 is connected between the second input terminal of first optocoupler 320 and the negative output terminal of diode bridge 210 and sets the amplitude of the voltage swing at the second output terminal (emitter) of second optocoupler 330. In some embodiments, transmit voltage reference 380 may comprise a Zener diode. In some embodiments, the Zener diode has a breakdown (Zener knee) voltage that is in a range of approximately 4.7 volts to 6.2 volts.

Figure 4:
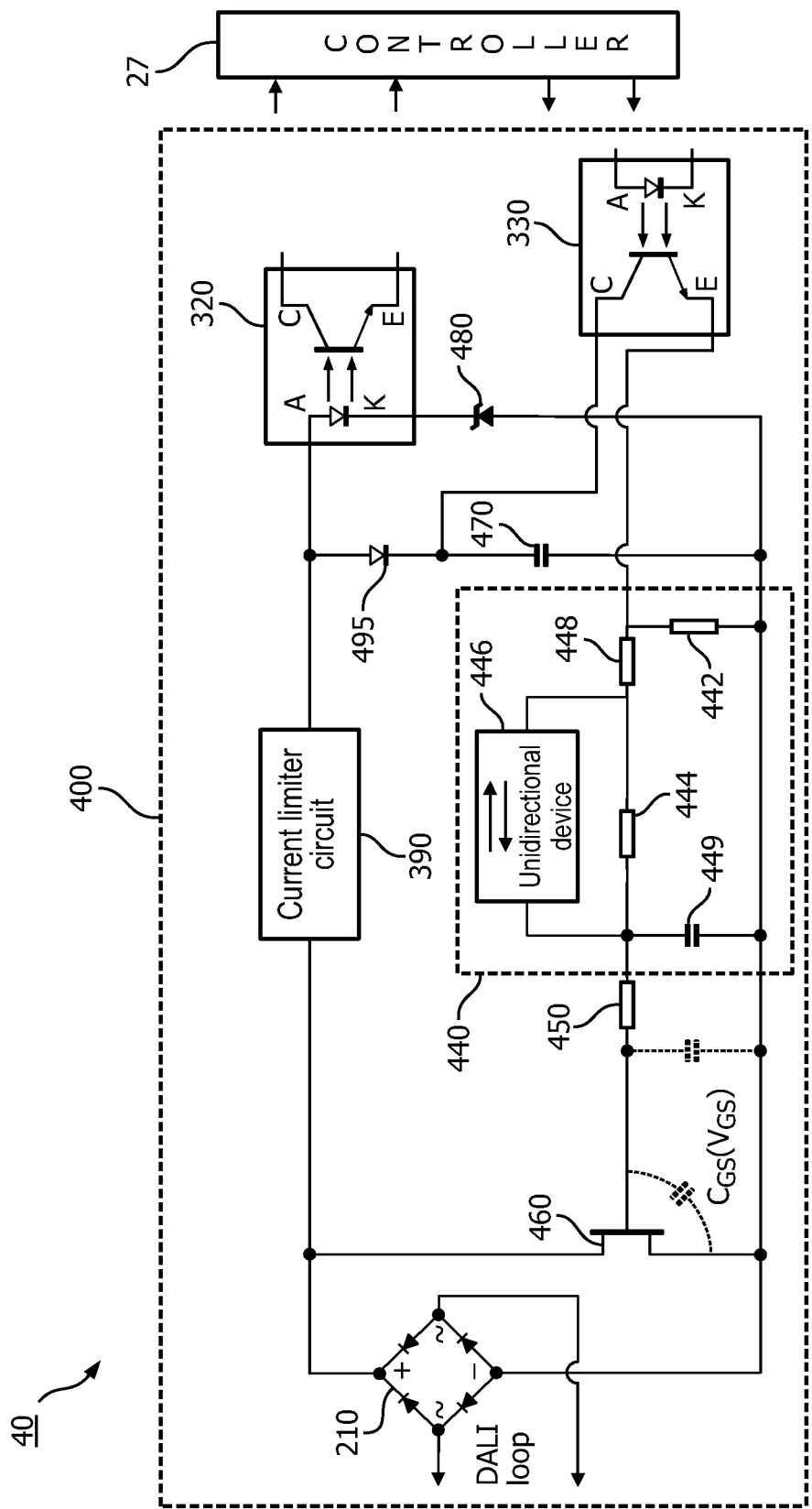
FIG. 4 is a circuit diagram of another embodiment of a device having an interface circuit for interfacing the device to a DALI bus.

FIG. 4 is a circuit diagram of another embodiment of a device 40 having an interface circuit 400 for interfacing the device to a DALI bus. In particular, device 40 may be one example embodiment of devices 20 and/or 30, and interface circuit 400 may be one example embodiment of interface circuit 200 and/or 300.

In the example illustrated in FIG. 4, device 40 is a DALI device, and may include a controller for controlling an operation of one or more lighting units via signals communicated over the DALI bus.

Interface circuit 400 includes: diode bridge 210; first optocoupler 320; second optocoupler 330; a first filter 440; a second filter 450; a field effect transistor 460; a transmit supply storage capacitor 470; a Zener diode 480; current limiter 390; and a diode 495.

For brevity, the descriptions of elements of interface circuit 400 which are identical to those in interface circuit 200 and/or 300 will not be repeated.

Supply storage capacitor 470 is illustrated as one example embodiment of transmit supply voltage 370 of interface circuit 300, and diode 495 is illustrated as one example embodiment of first unidirectional device 395 of interface circuit 300. Zener diode 480 is illustrated as one example embodiment of transmit supply voltage reference 380 of interface circuit 300.

Field effect transistor (FET) 460 is illustrated as one example embodiment of voltage-controlled variable resistance element 360 of FIG. 3.

In interface circuit 400, first filter 440 is a first-order low pass filter. First filter 440 includes: a shunt resistor 442 connected between the input terminal of first filter 440 and the negative terminal of diode bridge 210; first and second series resistors 444 and 448, respectively, connected between the input terminal of first filter 440 and the output terminal of first filter 440; a second unidirectional device 446 connected in parallel with either first series resistor 444 or second series resistor 448 (e.g., first series resistor 444 in FIG. 4); and a shunt capacitor 449 connected between the output terminal of first filter 440 and the negative output terminal of diode bridge 210. In some embodiments, second series resistor 448 may be omitted (shorted). In some embodiments, second unidirectional device 446 may be a diode. By means of second unidirectional device 446, first filter 440 decouples the charge and discharge paths so as to decouple the rise time of the transmit signal from the fall time of the transmit signal. In some embodiments, second unidirectional device 446 may be configured to only pass current from the input of first filter 440 to the output of first filter 440 while preventing a current from passing therethrough from the output of first filter 440 to the input of first filter 440. In other embodiments, second unidirectional device 446 may be configured to only pass current from the output of first filter 440 to the input of first filter 440 while preventing a current from passing therethrough from the input of first filter 440 to the output of first filter 440. More specifically, first filter 440 has a first time constant $\tau_C$ for the charging path and a second, different, time constant $\tau_D$ for the discharge path. In some beneficial embodiments, $\tau_D$ is greater than $\tau_C$. In that case, first filter 440 may slow down the fall time of data transitions in the transmit signal to a lesser degree with respect to the rise time of data transitions in the transmit signal. Due to the logic inversion through the FET 460, the opposite becomes true for the rise and fall times of the data transitions on the DALI bus.

In interface circuit 400, second filter 450 includes a series resistor connected between the output terminal of first filter 440 and a control terminal (e.g., the gate terminal) of field effect transistor 460. Optionally, second filter 450 also includes a shunt capacitor between the control terminal (e.g., the gate terminal) of field effect transistor 460 and the negative output terminal of diode bridge 210, which is in parallel with the parasitic gate-to-source capacitance $C_{GS}$ of field effect transistor 460. Beneficially, in second filter 450 the shunt capacitance between the gate terminal of field effect transistor 460 and the negative output terminal of diode bridge 210 increases when the input voltage to second filter 450 increases and is greater than a threshold value. Beneficially, the threshold value may equal the threshold voltage $V_{TH}$ of field effect transistor 460. In some embodiments, the shunt capacitor of second filter 450 may be omitted and the shunt capacitance of second filter 450 is realized by the parasitic gate-to-source capacitance $C_{GS}$ of field effect transistor 460, which beneficially is a function of the gate-to-source voltage $V_{GS}$: $C_{GS}(V_{GS})$. More specifically, the gate-to-source capacitance $C_{GS}$ of field effect transistor 460 increases as the gate-to-source voltage increases when the gate-to-source voltage is greater than the threshold voltage $V_{TH}$.

In similarity to interface circuits 200 and 300, in some embodiments of interface circuit 400, second filter 450 may be omitted. More specifically, the series resistor and shunt capacitor may be omitted, in which case the parasitic capacitance of field effect transistor 460 will still be present. Accordingly, the value of the shunt capacitor in first filter 440 should be reduced compared to an embodiment where both the first and second filters 440 and 450 are present.

It should be understood that although, to provide a concrete illustration, example embodiments have been described above in the context of a DALI device interfacing to a DALI bus, the concepts described above need not be so limited, and can be applied to other communication interfaces for other networks, systems, buses or loops, and in particular to a communication interface for a line-pair.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited. Also, reference numerals appearing in the claims in parentheses, if any, are provided merely for convenience and should not be construed as limiting the claims in any way.

What is claimed is:

1. A device, comprising:
an interface circuit configured to interface a controller with a Digital Addressable Lighting Interface (DALI) bus, wherein the interface circuit comprises:
 a diode bridge having polarity-independent input terminals configured to be coupled to the DALI bus, and further having a positive output terminal and a negative output terminal;
 a current limiter having an input and an output, wherein the input is connected to the positive output terminal of the diode bridge;
 a first optocoupler having first and second input terminals and first and second output terminals, wherein the first input terminal is connected to the output of the current limiter, and wherein the output terminals are connected to a receiver, the first optocoupler being configured to couple to the receiver a receive signal received on the DALI bus via the diode bridge;
 a supply storage capacitor connected between the output of the current limiter and the negative output terminal of the diode bridge;
 a first unidirectional device which allows current to flow from the output of the current limiter to charge a voltage on the supply storage capacitor and which prevents the voltage on the supply storage capacitor from discharging through the current limiter and the first optocoupler;
 a Zener diode connected between the second input terminal of the first optocoupler and the negative output terminal of the diode bridge, and configured to establish a voltage level of the voltage stored by the supply storage capacitor;
 a second optocoupler having first and second input terminals and first and second output terminals, wherein the first and second input terminals are connected to receive a transmit signal generated by the controller, and wherein the first output terminal is connected to receive a supply voltage from the supply storage capacitor;
 a first first-order low pass filter having an input terminal and an output terminal, wherein the input terminal is connected to the second output terminal of the second optocoupler, and wherein the first first-order low pass filter comprises,
  a shunt resistor connected between the input terminal of the first first-order low pass filter and the negative output terminal of the diode bridge,
  first and second series resistors connected between the input terminal of the first first-order low pass filter and the output terminal of the first first-order low pass filter,
  a second unidirectional device connected in parallel with one selected from the group consisting of the first and second series resistors, and
  a shunt capacitor connected between the output terminal of the first first-order low pass filter and the negative output terminal of the diode bridge;
 a second first-order low pass filter having an input terminal and an output terminal, wherein the input terminal is connected to the output terminal of the first first-order low pass filter, wherein the second first-order low pass filter has a voltage-dependent cutoff frequency; and
 a field effect transistor having first and second terminals connected respectively to the positive and negative output terminals of the diode bridge, and having a gate terminal connected to the output terminal of the second first-order low pass filter.

2. The device of claim 1, wherein the cutoff frequency of the second first-order low pass filter decreases as a function of an increasing input voltage provided thereto when the input voltage exceeds a threshold voltage of the field effect transistor.

3. The device of claim 1, wherein the second first-order low pass filter includes a shunt capacitance between the gate terminal of the field effect transistor and the negative output terminal of the diode bridge, wherein the shunt capacitance increases when an input voltage to the second first-order low pass filter increases and is greater than a threshold voltage of the field effect transistor.

4. The device of claim 1, further comprising the controller, wherein the controller is configured to control a lighting device.

5. The device of claim 1, wherein the Zener diode has a breakdown voltage that is between approximately 4.7 volts and approximately 6.2 volts.

6. A device, comprising:
an interface circuit configured to interface a controller with a Digital Addressable Lighting Interface (DALI) bus, wherein the interface circuit comprises:
 a diode bridge polarity-independent input terminals configured to be coupled to the DALI bus, and further having a positive output terminal and a negative output terminal;
 a first optocoupler operatively connected to the diode bridge and configured to couple to a receiver a receive signal received on the DALI bus via the diode bridge;
 a second optocoupler configured to receive a transmit signal generated by the controller;
 a voltage-controlled variable resistance element connected across the positive and negative output terminals of the diode bridge; and
 first and second first-order low pass filters cascaded between the second optocoupler and a control terminal of the voltage-controlled variable resistance element, wherein the first first-order low pass filter includes decoupled charge and discharge paths so as to decouple a rise time of the transmit signal from a fall time of the transmit signal such that the rise time is different from the fall time, and wherein the second first-order low pass filter has a voltage-dependent cutoff frequency,
 wherein the voltage-controlled variable resistance element is operatively connected to the diode bridge and configured to couple to the DALI bus via the diode bridge the transmit signal generated by the controller.

7. The device of claim 6, wherein the interface circuit further comprises a transmit voltage supply and a transmit voltage reference for setting a voltage of the transmit voltage supply, wherein the transmit voltage supply supplies a voltage to an output side of the second optocoupler, and wherein the transmit voltage reference is supplied a current from the DALI bus.

8. The device of claim 6, wherein the voltage-controlled variable resistance element comprises a field effect transistor connected between positive and negative output terminals of the diode bridge.

9. The device of claim 6, wherein the first first-order low pass filter comprises:
 first and second series resistors connected between an output of the second optocoupler and an input of the second first-order low pass filter;

a unidirectional device in parallel with one selected from the group consisting of the first and second series resistors; and a capacitor connected between the output terminal of the first first-order low pass filter and the negative output terminal of the diode bridge.

10. The device of claim 6, wherein the cutoff frequency of the second first-order low pass filter decreases when an input voltage to the second first-order low pass filter increases and is greater than a threshold value.

11. The device of claim 6, wherein the second first-order low pass filter includes a shunt capacitance between an output of the second first-order low pass filter and the negative output terminal of the diode bridge, wherein the shunt capacitance increases when an input voltage to the second first-order low pass filter increases and is greater than a threshold value.

12. The device of claim 11, wherein the voltage-controlled variable resistance element comprises a field effect transistor, and wherein the threshold value equals a threshold voltage of the field effect transistor.

13. The device of claim 12, wherein the shunt capacitance includes a gate-to-source capacitance of the field effect transistor.

14. The device of claim 6, further comprising the controller, wherein the controller is configured to control a lighting device.

15. A device, comprising:
an interface circuit configured to interface the device with a line-pair, wherein the interface circuit comprises:
a diode bridge having polarity-independent input terminals coupled to the line-pair, and further having a positive output terminal and a negative output terminal;
a first galvanic isolation device operatively connected to the diode bridge and configured to output a receive signal received on the line-pair via the diode bridge;
a second galvanic isolation device configured to receive a transmit signal;
a voltage-controlled variable resistance element connected across the positive and negative output terminals of the diode bridge; and
a first filter connected between the second galvanic isolation device and a control terminal of the voltage-controlled variable resistance element, wherein the first filter includes decoupled charge and discharge paths so as to decouple a rise time of the transmit signal from a fall time of the transmit signal,
wherein the voltage-controlled variable resistance element is operatively connected to the diode bridge and configured to couple the transmit signal to the line-pair via the diode bridge.

16. The device of claim 15, wherein the interface circuit further comprises a second filter connected between the first filter and the control terminal of the voltage-controlled variable resistance element, wherein the second filter has a voltage-dependent frequency characteristic.

17. The device of claim 16, wherein the first filter comprises:
first and second series resistors connected between an output of the second galvanic isolation device and an input of the second filter;
a unidirectional device in parallel with one selected from the group consisting of the first and second series resistors; and
a capacitor connected between the output terminal of the first first-order low pass filter and the negative output terminal of the diode bridge.

18. The device of claim 16, wherein the second filter has a cutoff frequency which decreases when an input voltage to the second filter increases and is greater than a threshold value.

19. The device of claim 16, wherein the second filter includes a shunt capacitance between an output of the second filter and the negative output terminal of the diode bridge, wherein the shunt capacitance increases when an input voltage to the second filter increases and is greater than a threshold value.

20. The device of claim 19, wherein the voltage-controlled variable resistance element comprises a field effect transistor, and wherein the threshold value equals a threshold voltage of the field effect transistor.

* * * * *